United States Patent
Liu et al.

(10) Patent No.: US 7,493,574 B2
(45) Date of Patent: Feb. 17, 2009

(54) METHOD AND SYSTEM FOR IMPROVING YIELD OF AN INTEGRATED CIRCUIT

(75) Inventors: Hongzhou Liu, Pittsburgh, PA (US); Rodney M. Phelps, Pittsburgh, PA (US)

(73) Assignee: Cadence Designs Systems, Inc., San Jose, CA (US)

( * ) Notice: Subject to any disclaimer, the term of this patent is extended or adjusted under 35 U.S.C. 154(b) by 238 days.

(21) Appl. No.: 11/361,928

(22) Filed: Feb. 23, 2006

(65) Prior Publication Data
US 2007/0198956 A1    Aug. 23, 2007

(51) Int. Cl.
*G06F 17/50* (2006.01)
(52) U.S. Cl. .................................. 716/1; 716/2; 716/4
(58) Field of Classification Search .................. 716/2, 716/4, 1
See application file for complete search history.

(56) References Cited

U.S. PATENT DOCUMENTS

| | | | |
|---|---|---|---|
| 6,757,873 B2 * | 6/2004 | Yamaguchi | 716/2 |
| 2003/0066034 A1 * | 4/2003 | Gross et al. | 716/1 |
| 2004/0073879 A1 * | 4/2004 | Chen et al. | 716/8 |
| 2005/0257178 A1 * | 11/2005 | Daems et al. | 716/2 |
| 2007/0180411 A1 * | 8/2007 | Swegat et al. | 716/4 |

* cited by examiner

*Primary Examiner*—Jack Chiang
*Assistant Examiner*—Magid Y Dimyan
(74) *Attorney, Agent, or Firm*—Wheelock Chan LLP; Thomas Chan

(57) ABSTRACT

Method and system for improving yield of an integrated circuit are disclosed. The method includes optimizing a design of the integrated circuit according to a set of predefined design parameters to generating design points that meet a set of predefined design specifications, analyzing the design points to form clusters comprising the design points, determining a representative design point from the clusters comprising the design points, running a statistical simulation to determine a yield of the design using the representative design point and a statistical model of manufacturing process variations, generating statistical corners in accordance with results of the statistical simulation, and optimizing the design in accordance with the statistical corners using an iterative process.

27 Claims, 6 Drawing Sheets

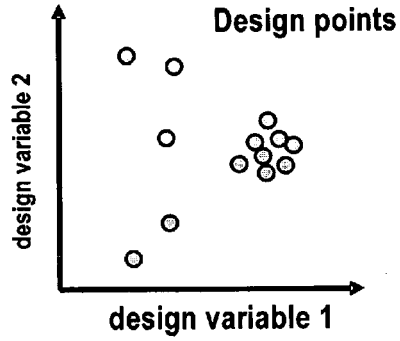
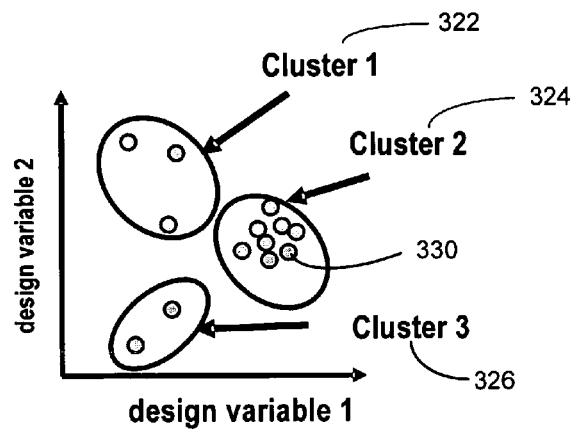
Figure 3B
Figure 3C
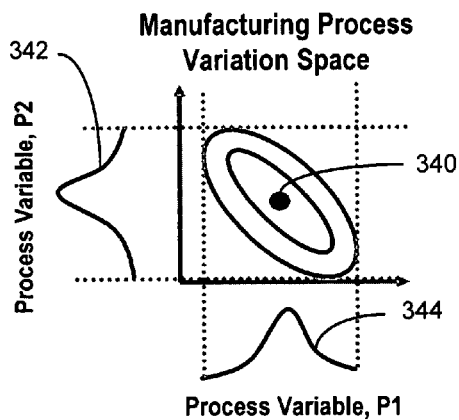
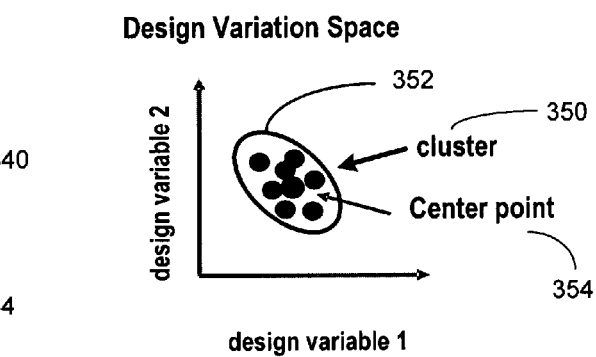
Figure 3D
Figure 3E

METHOD AND SYSTEM FOR IMPROVING YIELD OF AN INTEGRATED CIRCUIT

FIELD OF THE INVENTION

The present invention relates to the field of electronic design automation tools. In particular, the present invention relates to a method and system for improving yield of an integrated circuit.

BACKGROUND OF THE INVENTION

The yield of an integrated circuit is directly related to the profitability of a product, and that increasing yield by even a few percentage points may save a company millions of dollars. It is well known that integrated circuit manufacturing processes have inherent variations that cause the performance of a design to vary from one chip to another. A product's yield is the percentage of manufactured designs that pass all performance specifications.

The yield of an integrated circuit is the ratio of the number of chips that meets specifications in certain conditions to the total number of chips that are manufactured. There are two types of yield. One type is referred to as the functional field, which measures percentage of chips that meet the intended functionality. The other type is referred to as the parametric yield, which measures percentage of chips that meet all specifications. To maximize the parametric yield of an integrated circuit design, two classes of effects need to be considered. One class is the environmental effect, which includes temperature changes, power supply changes, etc. The other class is the manufacture-related effect, which is also referred to as the physical process variation. In general, the methodology to design a robust integrated circuit to account for the environmental changes and process variations is called design-for-yield (DFY) or design-for-parametric yield.

The physical process variation is caused by processing and masking imperfection. Normally it is modeled as two different types of statistical variations in circuit device model: 1) global variation or inter-die variation; and 2) local variation or intra-die variation. Design-for-yield (DFY) has becoming more and more important for high performance analog circuit design as the semiconductor processing technology approaches smaller sub-micron geometry. This is because the variation of device property, especially mismatch effects, increases as the device size shrinks to submicron processing technology. Designing an analog circuit to a 90 nm or newer processing technology would require more design effort to achieve a high yield. To solve this problem, there are various conventional methods that consider environmental and physical variations to optimize analog circuit yield.

One approach is the worst-case corner method. This method is limited for the following reasons. First, unlike most digital circuits, the typical analog circuit has many varied performance specifications and requires a richer set of simulations to qualify. The simple "fast" device and "slow" device worst-case corner methods are not adequate for analog circuits. Second, within-die variations (mismatch variations) are becoming more important than die-to-die variations (global process variations) for high performance analog circuits in deep-submicron technologies. The number of worst-case corners increases exponentially with the number of parameters that are varied. Thus, simulating worst-case corners can quickly become infeasible in determining mismatch effects. Furthermore, the worst-case corner method does not typically consider the distribution of parameters and the correlation information between the parameters. Consequently, an integrated circuit designed using this method often turns out to be either over-constrained or under-constrained, and therefore is not optimized in terms of cost and performance.

Another conventional approach is the response surface model (RSM) method. In this approach, response surface models can be built for both design variables and statistical variables to accelerate yield estimation and to maximize yield as part of the design methodology. The process of building RSMs includes model training, model selection, and model testing. Model training is a process to adjust model parameters to minimize model training error. Model selection is the process to select a corresponding model structure and complexity for a particular design. Model testing is a process to evaluate the quality of the model. The RSM method has high accuracy in low dimensional and weak nonlinear design space. The yield estimation process can be accelerated by running Monte Carlo simulations on RSM. By applying direction optimization techniques on some forms of RSM makes design-for-yield process easier. For examples, quadratic optimization can be used to find the optimum RSM. However, most analog designs are nonlinear. It is difficult to screen statistical and design variables. Thus, the number of samples to build RSM grows rapidly as the number of variables increase. Also, the error of the RSM method may lead to inaccurate yield estimation, which is another drawback of this approach.

Yet another convention approach is the worst-case distance (WCD) method. This method is illustrated as follows. First, assume there is a linear relationship between performance $f$ and statistical variable s, and assume there is a Gaussian distribution for statistical variable s. For performance function $f(s)$, the performance specification is U. In this approach, the performance variance is first computed. Then, the worst-case distance $\beta W$ is calculated. The yield can then be estimated by using the worst-case distance $\beta W$ for each performance. Next, the Worst-case parameter and tolerance class is derived. For the nonlinear circuit performance, sensitivity analysis is used for each performance and it iterates the worst-case distance process until the design converges. A drawback of this approach is that nonlinear circuit performance may not follow the Gaussian distribution, thus the yield estimation may be prone to error. Since sensitivity analysis has limitations for the nonlinear performance function, this method is useful for linear or nearly linear performance functions with a small number of statistical variables, and it is less useful for nonlinear performance specifications or for designs with a large number of parameters.

Therefore, there is a need for a method and system that maximize the yield of an integrated circuit in light of the manufacturing process variations. In particular, there is a need for an effective search process for finding design points that meet the design specifications and at the same time produce high yield in manufacturing.

SUMMARY

In one embodiment, a method for improving yield of an integrated circuit includes optimizing a design of the integrated circuit according to a set of predefined design parameters to generating design points that meet a set of predefined design specifications, analyzing the design points to form clusters comprising the design points, determining a representative design point from the clusters comprising the design points, running a statistical simulation to determine a yield of the design using the representative design point and a statistical model of manufacturing process variations, generating statistical corners in accordance with results of the statistical simulation, and optimizing the design in accordance with the statistical corners using an iterative process.

In another embodiment, a system for improving yield of an integrated circuit includes at least one processing unit for executing computer programs, a user interface for viewing representations of the integrated circuit on a display, and a memory for storing the computer programs. The system further includes means for optimizing a design of the integrated circuit according to a set of predefined design parameters to generating design points that meet a set of predefined design specifications, means for analyzing the design points to form clusters comprising the design points, means for determining a representative design point from the clusters comprising the design points, means for running a statistical simulation to determine a yield of the design using the representative design point and a statistical model of manufacturing process variations, means for generating statistical corners in accordance with results of the statistical simulation, and means for optimizing the design in accordance with the statistical corners using an iterative process.

In yet another embodiment, a computer program product for improving yield of an integrated circuit, having a medium storing executable program code, the computer program product includes code for optimizing a design of the integrated circuit according to a set of predefined design parameters to generating design points that meet a set of predefined design specifications, code for analyzing the design points to form clusters comprising the design points, code for determining a representative design point from the clusters comprising the design points, code for running a statistical simulation to determine a yield of the design using the representative design point and a statistical model of manufacturing process variations, code for generating statistical corners in accordance with results of the statistical simulation, and code for optimizing the design in accordance with the statistical corners using an iterative process.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

FIG. 3B illustrates a graphical representation of design points according to an embodiment of the present invention.

FIG. 3C illustrates a graphical representation of clusters of design points according to an embodiment of the present invention.

FIG. 3D illustrates a graphical representation of effects of manufacturing process variations according to an embodiment of the present invention.

FIG. 3E illustrates a graphical representation of effects of design variations according to an embodiment of the present invention.

DESCRIPTION OF EMBODIMENTS

Methods and systems are provided for improving yield of an integrated circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1:
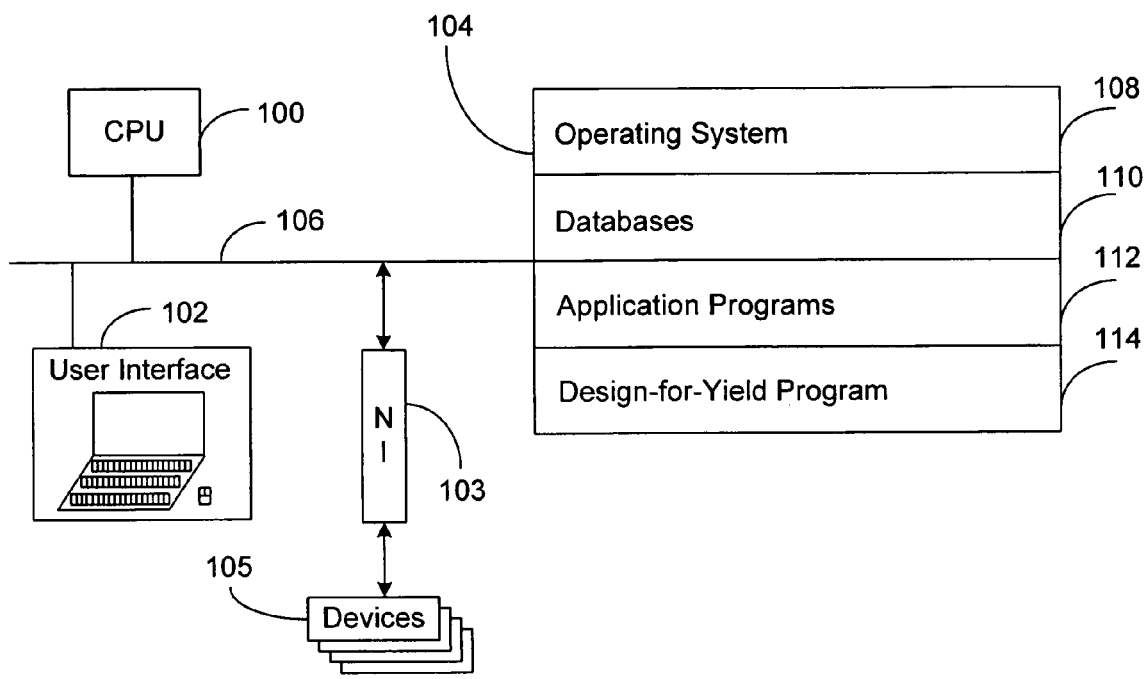
FIG. 1 illustrates an implementation of a circuit optimizer in a computer system according to an embodiment of the present invention.

In one embodiment, a circuit optimizer is implemented using a computer system schematically shown in FIG. 1. The computer system includes one or more central processing units (CPUs) 100, at least a user interface 102, a memory device 104, a system bus 106, and one or more bus interfaces for connecting the CPU, user interface, memory device, and system bus together. The computer system also includes at least one network interface 103 for communicating with other devices 105 on a computer network. In alternative embodiments, much of the functionality of the circuit simulator may be implemented in one or more application-specific integrated circuits (ASICs) or field-programmable gate arrays (FPGAs), thereby either eliminating the need for a CPU, or reducing the role of the CPU in generating the initial layout of the integrated circuit.

The memory device 104 may include high-speed random-access memory and may also include non-volatile memory, such as one or more magnetic disk storage devices. The memory device 104 may also include mass storage that is remotely located from the CPU(s) 100. The memory device 104 preferably stores:

- an operating system 108 that includes procedures for handling various basic system services and for performing hardware-dependent tasks;
- databases 110 for storing information of the integrated circuit;
- application programs 112 for performing other user-defined applications and tasks; and
- a design-for-yield program 114 for optimizing the yield of the integrated circuit.

The database 110, the application programs 112, and the design-for-yield program 114 may include executable procedures, sub-modules, tables, and other data structures. In other embodiments, additional or different modules and data structures may be used, and some of the modules and/or data structures listed above may not be used.

Figure 2:
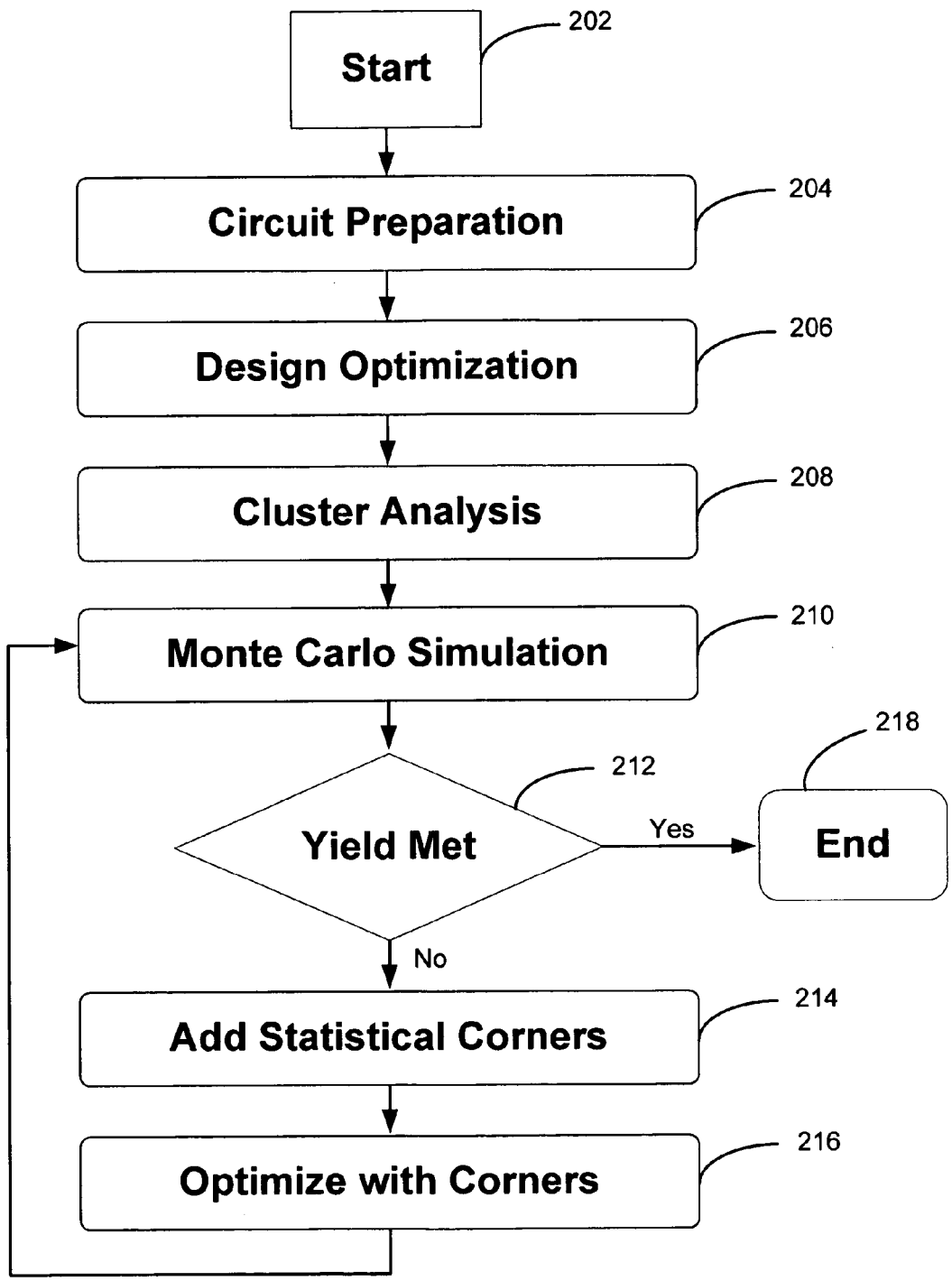
FIG. 2 illustrates a method of improving yield of an integrated circuit design according to an embodiment of the present invention.

FIG. 2 illustrates a method of improving yield of an integrated circuit design according to an embodiment of the present invention. This method employs a parallel optimization technique to optimize the integrated circuit design, where multiple optimizers are run in parallel and a common database is shared by the multiple optimizers. This optimization is performed by considering both the design specifications and the manufacturing process variations. In one approach, the method starts in step 202 and thereafter moves to step 204 where the circuit preparation step is performed. In this step, the method 1) chooses a circuit topology; 2) determines a set of parameters to optimize; 3) sets the range for each design parameter; and 4) sets performance goals of the circuit. For example, the range of a design parameter, such as a resistor or capacitor, is the minimum and maximum values of the design parameter. The performance goals, such as the power consumption and the speed (clock rate) of the integrated circuit, are set in this step.

In step 206, the method performs design optimization on the integrated circuit according to a set of predefined design specifications. In this step, the method explores and optimizes the design in the analog space to find a set of design points that meet the design specifications. For example, the parameters to be optimized for an operational amplifier may include the gain, noise, area, and power consumption of the operational amplifier. One design goal is to determine the transistor size that meets the above design parameters. A method for optimizing an integrated circuit design is described in U.S. patent application "Method and System for Evaluating Design Costs of an Integrated Circuit," Ser. No. 11/078,573, which is incorporated herein in its entirety by reference.

In step 208, the method performs a cluster analysis of the design points generated by the design optimization in step 206. The cluster analysis process may employ different algorithms for grouping objects of similar type into their respective categories. In particular, cluster analysis is an exploratory data analysis tool that sorts different objects into groups in such a way that the degree of association between two objects is maximal if they belong to the same group, and the degree of association between objects is minimal if they belong to different groups. One approach of the cluster analysis is described below in association with FIG. 3.

In step 210, the Monte Carlo simulation is employed to estimate the yield of the integrated circuit taken into consideration of the manufacturing process variations. In one approach, the Monte Carlo simulation is run on multiple computers in parallel to generate samples from a given probability distribution to estimate expectations of functions under distributions. Specifically, the Monte Carlo simulation 1) generates a uniform distribution for each statistical variable; 2) generates a cumulative density function (CDF) for a specified distribution for each statistical variable; 3) uses inverse of CDF to map uniform distribution to a desired distribution, and 4) applies correlation between the statistical variables if necessary. Note that different sampling methods, such as the uniform sampling and stratified sampling, may be employed in the Monte Carlo simulation. The accuracy of the Monte Carlo estimation is independent of the dimension of the space sampled, and the accuracy convergence is inversely related to the square root of the number of samples.

In step 212, a determination is made as to whether the goal of design yield is met. If the design yield is met (212_Yes), the method goes to step 218. In the alternative, if the design yield is not met (212_No), the method moves to step 214 where statistical corners generated from the Monte Carlo simulation (step 210) are added to the optimization process. The statistical corner analysis is discussed below in association with FIG. 4A.

In step 216, the method performs design optimization with the statistical corners. Then, it goes to step 210 to repeat the Monte Carlo simulation. The method ends at step 218.

Figure 3A:
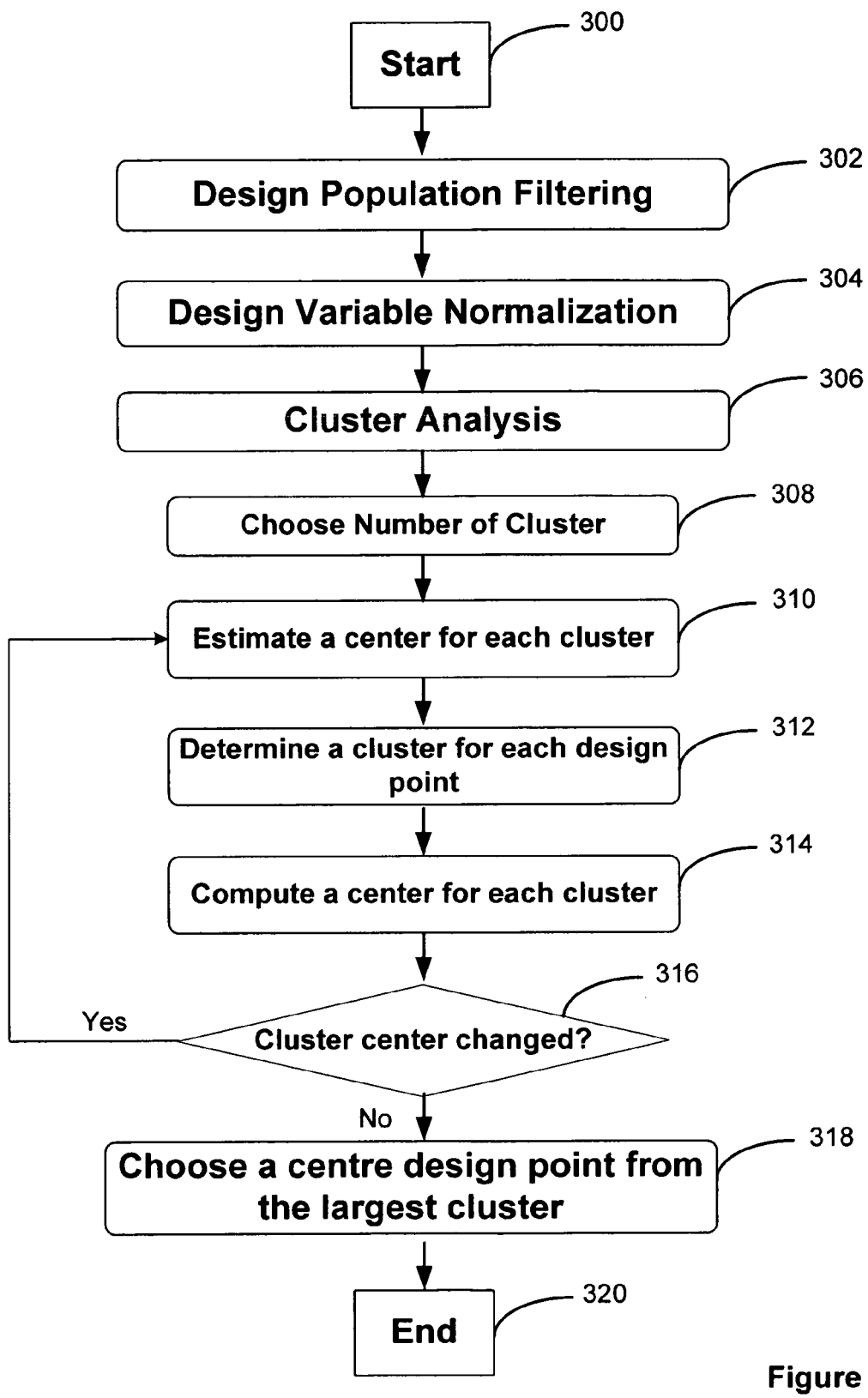
FIG. 3A illustrates a cluster analysis according to an embodiment of the present invention.

FIG. 3A illustrates a cluster analysis according to an embodiment of the present invention. As discussed in step 210 of FIG. 2, the Monte Carlo simulation is employed to achieve accurate circuit yield estimation. However, the Monte Carlo simulation is a time-consuming process. The goal of cluster analysis is to choose possible high-yield design points in design variation insensitive regions for running the Monte Carlo simulation. In one approach, design points are chosen based on their corresponding optimization costs. An optimization cost a value for measuring whether one design point is better than another design point. However, these design points may have trade-offs among different design specifications. For example, a first design point may have better performance in a first specification than a second design point, but the first design point may have worse performance in a second specification than the second design point. In other cases, some design points may have similar performance according to the design specifications, but have different yields when manufacturing process variations are taken into consideration. In these cases, Monte Carlo simulations are run to identify high-yield design points.

As shown in FIG. 3A, the method of cluster analysis starts in step 300 and thereafter goes to step 302 where the method performs design population filtering on design points in the database created by the design optimization step 206 in FIG. 2. This filtering step removes design points in the database that do not meet the design specifications under normal conditions. The remaining design points in the database are likely to have higher yield in manufacturing as they meet the design specifications under normal conditions.

In step 304, the method performs linear normalization of each design variable value to a predetermined range, such as between 0 and 1. This step enables all design variables to have the same contribution to the distance calculation, where variable_normalized is equal to the ratio of (variable_original-variable_minimum) to (variable_maximum-variable_minimum). For example, for a resistor having a resistance of 1500 ohm, if the maximum variable resistance is 2000 ohm and the minimum variable resistance is 1000 ohm, then the normalized resistance is equal to 0.5 (a ratio of (1500-1000)/(2000-1000)).

In step 306, the method starts performing cluster analysis of the design points, which includes steps 308 to 318. FIG. 3B illustrates a graphical representation of design points according to an embodiment of the present invention. As shown in FIG. 3B, design points are plotted in a two-dimensional graph defined by a first design variable (design variable 1) and a second design variable (design variable 2). A person skilled in the art would appreciate that in other embodiments, the design points may be affected by multiple design variables and the design points may be plotted in a multi-dimensional graph.

In step 308, the method chooses a number of clusters for analysis. FIG. 3C illustrates a graphical representation of clusters of design points according to an embodiment of the present invention. In this example, the design points of FIG. 3B are grouped into three clusters, namely, cluster 1 (322), cluster 2 (324), and cluster 3 (324). In other words, three clusters are chosen for this analysis. Similar to FIG. 3B, clusters of design points are plotted in a two-dimensional graph defined by a first design variable (design variable 1) and a second design variable (design variable 2). A person skilled in the art would appreciate that in other embodiments, the design points may be affected by multiple design variables and the design points and their corresponding clusters may be plotted in a multi-dimensional graph.

In step 310, the method estimates a cluster center for each cluster based on the number of design points in the corresponding cluster. In step 312, for each design point, the method determines a cluster center that is the closest to that design point, and records the design point belonging to that cluster. For example, the design point 330 is closest to the center of cluster 2, and thus it is recorded to belong to cluster 2 (324).

In step 314, the method computes a center for each cluster using the design points in that cluster and assigns the computed center as the new cluster center. In step 316, a determination is made as to whether the new cluster center computed in step 314 has changed by a predefined margin over the previous cluster center for the corresponding cluster. If the new cluster center has not changed within a predetermined number of iterations (316_No), for example two iterations, the method goes to step 318. In the alternative, if the new cluster center has changed by a predefined margin or within a predetermined number of iterations (316_Yes), the method goes back to step 310 and repeats the steps 310 to 316.

In step 318, the method chooses a center design point from the largest cluster, and uses it as the starting design point for the Monte Carlo simulation in step 210 of FIG. 2. The method ends in step 320.

FIG. 3D illustrates a graphical representation of effects of manufacturing process variations according to an embodiment of the present invention. As shown in FIG. 3D, a design point 340 and its potential space of variation are plotted in a two-dimensional graph defined by a first process variable (process variable P1) having a first distribution 342 and a second process variable (process variable P2) having a second distribution 344. A person skilled in the art would appreciate that in other embodiments, the manufacturing process variation space may be affected by multiple process variables having different types of distributions, such as Gaussian, uniform, log-normal, or other user-defined distributions, and the design point under consideration may be plotted in a multi-dimensional graph.

FIG. 3E illustrates a graphical representation of effects of design variations according to an embodiment of the present invention. As shown in FIG. 3D, a cluster of design points 350 and its potential space of variation 352 are plotted in a two-dimensional graph defined by a first design variable (design variable 1) and a second design variable (design variable 2). A person skilled in the art would appreciate that in other embodiments, the design variation space may be affected by design variables, and the cluster of design points under consideration may be plotted in a multi-dimensional graph. The center point of this cluster is indicated by item number 354. Note that within a cluster of good design points, small changes in the design variation space can result in another good design. Therefore, this design point is likely to have high yield despite manufacturing process variations.

In step 318, the method selects the cluster with largest number of design points, and selects a center point, such as the center point 354 of FIG. 3E, from the cluster. Since the selected center point has more neighbors that meet design specifications than other points in the cluster, it is likely to have high yield in manufacturing. The center design point selected is used as a starting design point for running the Monte Carlo simulation in step 210 of FIG. 2. The method ends in step 320.

Figure 4A:
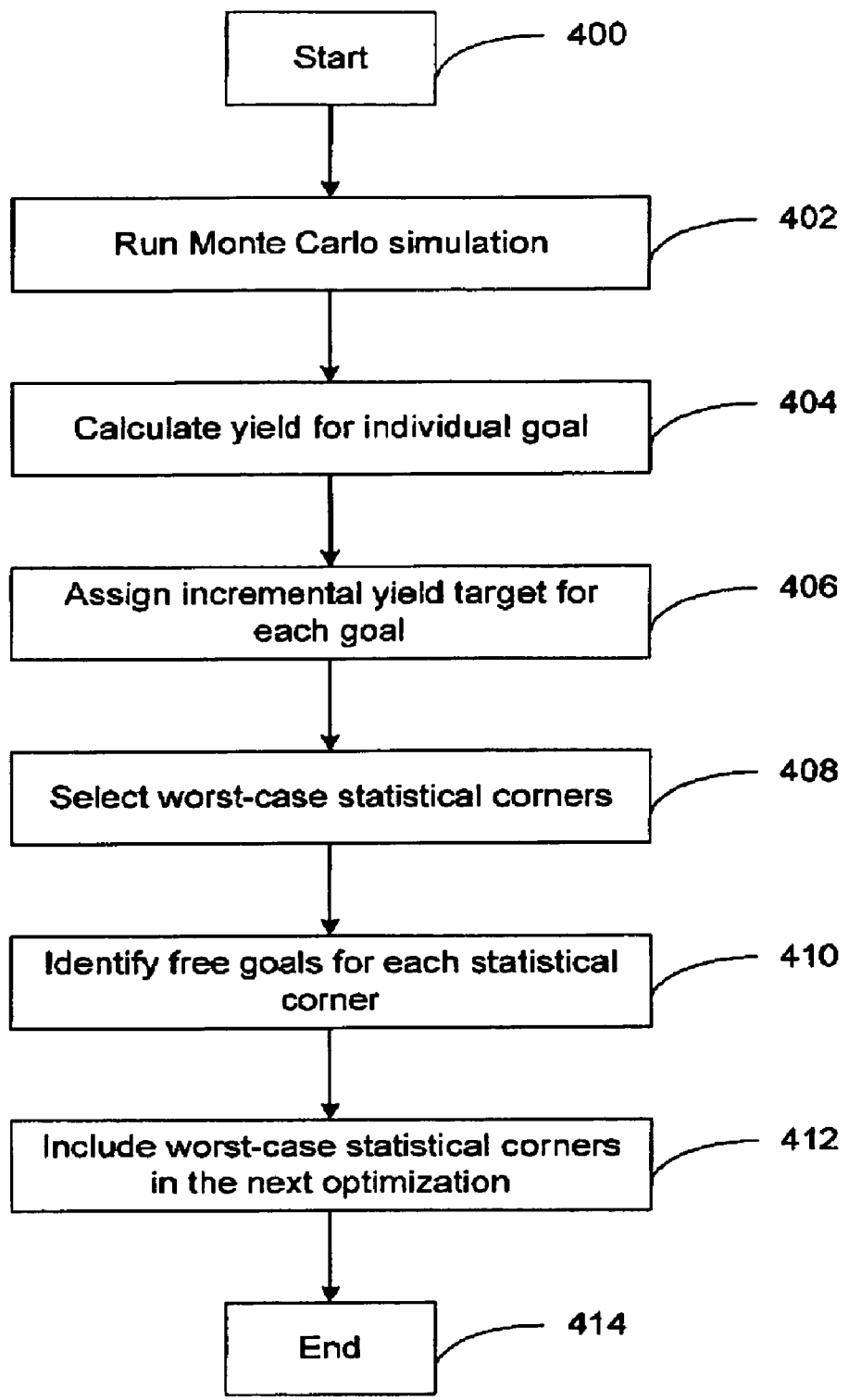
FIG. 4A illustrates a statistical corner analysis according to an embodiment of the present invention.

FIG. 4A illustrates a statistical corner analysis according to an embodiment of the present invention. Environmental and process parameters vary from one die to another (inter-die variation) and across different components within the same die (intra-die variations). Note that the inter-die variation may be called correlated variation because all devices in the same die vary in the same way, while the intra-die variation may be called uncorrelated variation because all devices in the same die vary in their own ways. These variations may be captured during the fabrication process and modeled as a statistical distribution. For each design specification performance goal, a representative point may be selected from a statistical distribution as the worst-case statistical corner. FIG. 4A describes a method to identify statistical corners in a design-for-yield process. The method starts in step 400, thereafter, the method goes to step 402 where the Monte Carlo simulation is run to compute a distribution of circuit goals that are impacted by environmental and process parameters. Each point obtained by the Monte Carlo simulation represents a unique combination of environmental and process parameters.

In step 404, the method calculates a yield for each individual performance goal. Based on the specification of the current goal, an estimated yield of the performance goal can be calculated as the ratio of the number of points from the Monte Carlo simulation (also referred to as the Monte Carlo point) that meet the design specification to the total number of Monte Carlo runs.

Figure 4B:
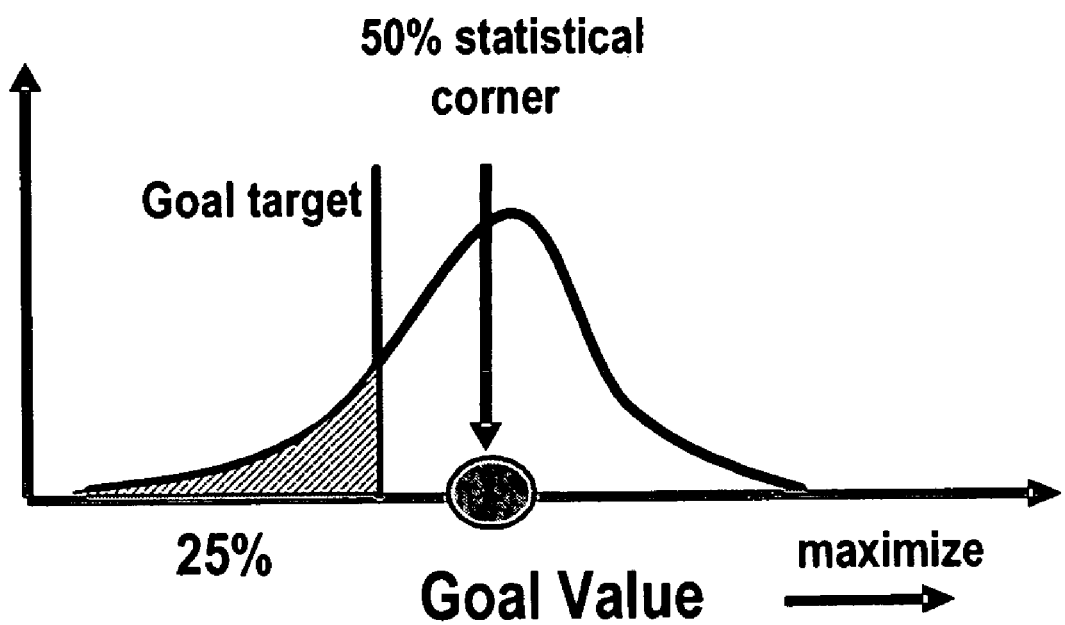
FIG. 4B illustrates a graphical representation of a worst-case statistical corner of a corresponding performance goal according to an embodiment of the present invention.

In step 406, the method assigns incremental yield target for each specification goal. FIG. 4B illustrates a graphical representation of a worst-case statistical corner of a corresponding performance goal according to an embodiment of the present invention. In this example, if current yield for goal A is at 25%, the incremental yield target is 50%. Note that an incremental yield target is chosen for particular circuit and process conditions, since it may not always be possible to achieve 100% yield. In this example, a 25% increase for each incremental goal is used.

In step 408, based on an incremental yield target of each performance goal, the worst-case statistical corners are chosen from the Monte Carlo simulation. It is 25% worse than the current goal specification. Note that other incremental yield target, such as 10%, may be chosen based on designer's expectation of the yield to be achieved or based on other design objectives.

In step 410, the method finds free goals for each statistical corner based on dependency of the performance goals that may be obtained in a simulation run. In one approach, free goals refer to the performance goals of an integrated circuit obtained as a by-product of another simulation. In some cases, each type of analog circuit simulation run may generate different circuit performance goal values. For example, an AC circuit simulation for an operational amplifier may generate performance goal values, such as the gain, phase margin, and unit gain frequency goal values. To obtain a performance goal value for the gain of the operational amplifier, an AC circuit simulation is run, then the performance goal values for phase margin and unit gain frequency performance goals are produced as a by-product of the gain simulation, as no extra circuit simulation is required to obtain the values for phase margin and unit gain frequency in this case.

Table 1 illustrates dependency relationships of performance goals according to an embodiment of the present invention. As shown in Table 1 and discussed above, for every performance goal, a corresponding dependency relationship may be built. After the dependency relationship for all performance goals are established, they are grouped and enabled for the worst-case corners of the free goals. In this example, Goal A and Goal B are computed using a first simulation and Goal C and Goal D are computed using a second simulation.

TABLE 1

| Goals | Corner For Goal A | Corner For Goal B | Corner For Goal C | Corner For Goal D |
|---|---|---|---|---|
| Goal A | Enable | Free | | |
| Goal B | Free | Enable | | |
| Goal C | | | Enable | Free |
| Goal D | | | Free | Enable |

After the free goals for each statistical corner are enabled, each free statistical corner for the performance goal is checked. If the statistical corner (Monte Carlo point) is worse than the incremental yield target, the free statistical corner is disabled.

In step 412, the worst-case statistical corners are used in the next optimization process of the integrated circuit (step 216 of FIG. 2). The method ends in step 414.

There are at least several advantages of the disclosed design-for-yield method over the conventional methods. First, it improves the manufacturing yield of the integrated circuit by considering the environmental and manufacturing variations early in the design process. As a result, it reduces number of iterations in reaching the design goals and reduces time to volume production of the integrated circuit. In addition, the method is more efficient than the conventional methods. Before running the Monte Carlo simulation (which is very expensive), the cluster analysis method can identify the design variation insensitive regions that may produce high-yield designs. The goal-sharing ability of the method allows the user to achieve a high yield faster. Furthermore, the statistical corner analysis method can handle both global variations and local mismatch variations. Since the method is based on incremental improvement over each performance goal, the design would not be unnecessarily over-constrained.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for improving yield of an integrated circuit, comprising:
   optimizing a design of the integrated circuit according to a set of predefined design parameters to generate design points that meet a set of predefined design specifications;
   analyzing the design points to form clusters comprising the design points;
   determining a representative design point from the clusters comprising the design points;
   running a statistical simulation to determine a yield of the design using the representative design point and a statistical model of manufacturing process variations;
   generating statistical corners in accordance with results of the statistical simulation; and
   optimizing the design in accordance with the statistical corners using an iterative process.

2. The method of claim 1, wherein analyzing the design points comprises:
   choosing a number of clusters;
   creating an estimated cluster center for each cluster according to the number of design points in the corresponding cluster;
   for each design point, determining the estimated cluster center closest to that design point; and
   recording the design point belonging to the corresponding cluster.

3. The method of claim 2, wherein analyzing the design points further comprises:
   filtering the design points; and
   normalizing the design points to a predetermined range.

4. The method of claim 1, wherein determining a representative design point comprises:
   determining the largest cluster among the clusters comprising the design points;
   computing a center design point for the largest cluster; and
   assigning the center design point of the largest cluster to be the representative design point.

5. The method of claim 1, wherein the statistical simulation is a Monte Carlo simulation.

6. The method of claim 1, the statistical model is an element selected from the group consisting of Gaussian distribution, log-normal distribution, and uniform distribution.

7. The method of claim 1, wherein the statistical corners comprises incremental worst-case yields that meet specifications of the design.

8. The method of claim 1, wherein generating statistical corners comprises:
   running a statistical simulation to compute a distribution of design goals;
   calculating yield for each goal; and
   assigning incremental yield target for each goal.

9. The method of claim 1, wherein generating statistical corners further comprises:
   selecting worst-case statistical corners according to an incremental yield target for each goal; and
   identifying free goals for each statistical corner according to simulation dependency of design goals.

10. A system for improving yield of an integrated circuit, comprising:
    at least one processing unit for executing computer programs;
    a user interface for viewing representations of the integrated circuit on a display;
    a memory for storing the computer programs;

means for optimizing a design of the integrated circuit according to a set of predefined design parameters to generate design points that meet a set of predefined design specifications;

means for analyzing the design points to form clusters comprising the design points;

means for determining a representative design point from the clusters comprising the design points;

means for running a statistical simulation to determine a yield of the design using the representative design point and a statistical model of manufacturing process variations;

means for generating statistical corners in accordance with results of the statistical simulation; and means for optimizing the design in accordance with the statistical corners using an iterative process.

11. The system of claim 10, wherein the means for analyzing the design points comprise:

means for choosing a number of clusters;

means for creating an estimated cluster center for each cluster according to the number of design points in the corresponding cluster;

for each design point, means for determining the estimated cluster center closest to that design point; and means for recording the design point belonging to the corresponding cluster.

12. The system of claim 11, wherein the means for analyzing the design points further comprise:

means for filtering the design points; and means for normalizing the design points to a predetermined range.

13. The system of claim 10, wherein the means for determining a representative design point comprise:

means for determining the largest cluster among the clusters comprising the design points;

means for computing a center design point for the largest cluster; and means for assigning the center design point of the largest cluster to be the representative design point.

14. The system of claim 10, wherein the statistical simulation is a Monte Carlo simulation.

15. The system of claim 10, the statistical model is an element selected from the group consisting of Gaussian distribution, log-normal distribution, and uniform distribution.

16. The system of claim 10, wherein the statistical corners comprises incremental worst-case yields that meet specifications of the design.

17. The system of claim 10, wherein the means for generating statistical corners comprise:

means for running a statistical simulation to compute a distribution of design goals;

means for calculating yield for each goal; and means for assigning incremental yield target for each goal.

18. The system of claim 10, wherein the means for generating statistical corners further comprise:

means for selecting worst-case statistical corners according to an incremental yield target for each goal; and means for identifying free goals for each statistical corner according to simulation dependency of design goals.

19. A computer program product for improving yield of an integrated circuit, comprising a medium storing executable program code, the computer program product comprising:

code for optimizing a design of the integrated circuit according to a set of predefined design parameters to generate design points that meet a set of predefined design specifications;

code for analyzing the design points to form clusters comprising the design points;

code for determining a representative design point from the clusters comprising the design points;

code for running a statistical simulation to determine a yield of the design using the representative design point and a statistical model of manufacturing process variations;

code for generating statistical corners in accordance with results of the statistical simulation; and code for optimizing the design in accordance with the statistical corners using an iterative process.

20. The computer program product of claim 19, wherein the code for analyzing the design points comprises:

code for choosing a number of clusters;

code for creating an estimated cluster center for each cluster according to the number of design points in the corresponding cluster;

for each design point, code for determining the estimated cluster center closest to that design point; and code for recording the design point belonging to the corresponding cluster.

21. The computer program product of claim 19, wherein the code for analyzing the design points further comprises:

code for filtering the design points; and code for normalizing the design points to a predetermined range.

22. The computer program product of claim 19, wherein the code for determining a representative design point comprises:

code for determining the largest cluster among the clusters comprising the design points;

code for computing a center design point for the largest cluster; and code for assigning the center design point of the largest cluster to be the representative design point.

23. The computer program product of claim 19, wherein the statistical simulation is a Monte Carlo simulation.

24. The computer program product of claim 19, the statistical model is an element selected from the group consisting of Gaussian distribution, log-normal distribution, and uniform distribution.

25. The computer program product of claim 19, wherein the statistical corners comprises incremental worst-case yields that meet specifications of the design.

26. The computer program product of claim 19, wherein the code for generating statistical corners comprises:

code for running a statistical simulation to compute a distribution of design goals;

code for calculating yield for each goal; and code for assigning incremental yield target for each goal.

27. The computer program product of claim 19, wherein the code for generating statistical corners further comprises:

code for selecting worst-case statistical corners according to an incremental yield target for each goal; and code for identifying free goals for each statistical corner according to simulation dependency of design goals.

* * * * *